(12) United States Patent
Chong

(10) Patent No.: US 9,178,498 B2
(45) Date of Patent: Nov. 3, 2015

(54) RECONFIGURABLE MULTI-PATH INJECTION LOCKED OSCILLATOR

(71) Applicant: Futurewei Technologies, Inc., Plano, TX (US)

(72) Inventor: Euhan Chong, Ottawa (CA)

(73) Assignee: Futurwei Technologies, Inc., Plano, TX (US)

( * ) Notice: Subject to any disclaimer, the term of this patent is extended or adjusted under 35 U.S.C. 154(b) by 0 days.

(21) Appl. No.: 14/045,052

(22) Filed: Oct. 3, 2013

(65) Prior Publication Data

US 2015/0097629 A1  Apr. 9, 2015

(51) Int. Cl.
*H03K 3/03* (2006.01)
*H03K 5/00* (2006.01)

(52) U.S. Cl.
CPC .... *H03K 3/0322* (2013.01); *H03K 2005/00228* (2013.01)

(58) Field of Classification Search
CPC ..... H03K 3/0322; H03K 3/0315; H03K 3/03; H03L 7/0995
USPC .......................................................... 331/57
See application file for complete search history.

(56) References Cited

U.S. PATENT DOCUMENTS

| | | | | |
|---|---|---|---|---|
| 6,094,103 | A * | 7/2000 | Jeong et al. | 331/57 |
| 7,102,449 | B1 * | 9/2006 | Mohan | 331/57 |
| 7,521,977 | B2 * | 4/2009 | Ko | 327/276 |
| 7,592,877 | B2 * | 9/2009 | Shiramizu et al. | 331/57 |
| 7,629,856 | B2 * | 12/2009 | Thaller | 331/57 |

OTHER PUBLICATIONS

Jeong, D.-Y., et al. "CMOS Current-Controlled Oscillators Using Multiple-Feedback-Loop Ring Architectures," 1997 IEEE International Solid-State Circuits Conference, Session 23/Analog Techniques/Paper SP 23.5, 3 pgs.
Chong, U.S. Appl. No. 13/901,815; Title: "Injection-locked Oscillator Apparatus and Method," filed May 24, 2013, Specification 20 pages, 5 Drawing Sheets (Figs. 1-8).
Hafez, A., et al., "A Multi-Phase Multi-Frequency Clock Generator Using Superharmonic Injection Locked Multipath Ring Oscillators as Frequency Dividers," IEEE Asian Solid-State Circuits Conference, Nov. 12-14, 2012, pp. 289-292.
Hafez, A., et al., "Design and Optimization of Multipath Ring Oscillators," IEEE Transactions on Circuits and Systems—I: Regular Papers, vol. 58, No. 10, Oct. 2011, pp. 2332-2345.
Mohan, S.S., et al., "Differential Ring Oscillators with Multipath Delay Stages," IEEE Custom Integrated Circuits Conference, Sep. 18, 2005, pp. 503-506.

(Continued)

*Primary Examiner* — Ryan Johnson
(74) *Attorney, Agent, or Firm* — Conley Rose, P.C.; Grant Rodolph; William H. Dietrich

(57) ABSTRACT

A ring oscillator comprising three or more delay cells, each of which comprises a plurality of differential input leads and a differential output lead, wherein each of the plurality of differential input leads comprises one or more inverters, wherein the three or more delay cells are inter-connected forming a plurality of loop paths, wherein each loop path connects the differential output lead of each delay cell to a corresponding differential input lead of another delay cell, wherein each loop path provides an inverter strength determined by a number of inverters in a corresponding differential input lead of each delay cell, wherein the plurality of loop paths are configured to generate an oscillating signal with an operating frequency, and wherein the operating frequency is tunable by digitally adjusting one or more inverter strengths in one or more of the plurality of loop paths.

20 Claims, 11 Drawing Sheets

(56) References Cited

OTHER PUBLICATIONS

Chen, Z., et al., "The Design and Analysis of Dual-Delay-Path Ring Oscillators," IEEE Transactions on Circuits and Systems—I: Regular Papers, vol. 58, No. 3, Mar. 2011, pp. 470-478.

Foreign Communication From a Counterpart Application, PCT Application No. PCT/US2014/058290, International Search Report dated Dec. 19, 2014, 4 pages.
Foreign Communication From a Counterpart Application, PCT Application No. PCT/US2014/058290, Written Opinion dated Dec. 19, 2014, 17 pages.

* cited by examiner

RECONFIGURABLE MULTI-PATH INJECTION LOCKED OSCILLATOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A ring oscillator may comprise multiple delay stages or cells configured to generate a self-sustaining oscillating signal with an operating frequency. An injection locked oscillator (ILO) is one type of ring oscillator that tracks its operating frequency to an input reference clock. ILOs can be used for various purposes such as frequency multiplication, frequency division, and clock generation. An ILO may have a high input tracking bandwidth, which helps rejecting a bias noise while providing a low-noise and multi-phase clock. The multi-phase clock may be needed by phase rotators in a digital clock and data recovery (CDR) device, e.g., to sample and track received data.

In modern devices, to fit various applications, ring oscillators may be designed to cover a wide frequency tuning range (e.g., from 2 gigahertz (GHz) to 7.5 GHz or higher). One challenge in the design of such ring oscillators is to cover a wide frequency range with sufficient amplitude and low phase noise, while minimizing power and area overhead.

SUMMARY

In one embodiment, the disclosure includes a ring oscillator comprising three or more delay cells, each of which comprises a plurality of differential input leads and a differential output lead, wherein each of the plurality of differential input leads comprises one or more inverters, wherein the three or more delay cells are inter-connected forming a plurality of loop paths, wherein each loop path connects the differential output lead of each delay cell to a corresponding differential input lead of another delay cell, wherein each loop path provides an inverter strength determined by a number of inverters in a corresponding differential input lead of each delay cell, wherein the plurality of loop paths are configured to generate an oscillating signal with an operating frequency, and wherein the operating frequency is tunable by digitally adjusting one or more inverter strengths in one or more of the plurality of loop paths.

In another embodiment, the disclosure includes a ring oscillator comprising a plurality of delay cells, each of which comprises a primary input lead, a second input lead, and an output lead, wherein the primary input lead of each delay cell comprises a first number of inverter slices, wherein the second input lead of each delay cell comprises a second number of inverter slices, wherein the plurality of delay cells are coupled to provide a primary path and a second path, wherein the primary path connects the output lead of each delay cell to a corresponding primary input lead of another delay cell, wherein the second path further connects the output lead of each delay cell coupled to a corresponding second input lead of another delay cell, and wherein the primary path and the second path are configured to generate an oscillating signal with an operating frequency; and a digital controller coupled to the plurality of delay cells and configured to control a first inverter strength in the primary path and a second inverter strength in the second path, wherein the first and second inverter strengths are determined by the first and second numbers of inverter slices, respectively, wherein controlling at least one of the first and second inverter strengths tunes the operating frequency.

In yet another embodiment, the disclosure includes a method implemented by a ring oscillator that comprises three or more delay cells and a plurality of paths formed by connections among the delay cells, the method comprising generating an oscillating signal that has an operating frequency and an amplitude, and calibrating the oscillating signal by digitally controlling at least one inverter strength in at least one of the plurality of paths, wherein controlling the at least one inverter strength tunes the operating frequency, or the amplitude, or both.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
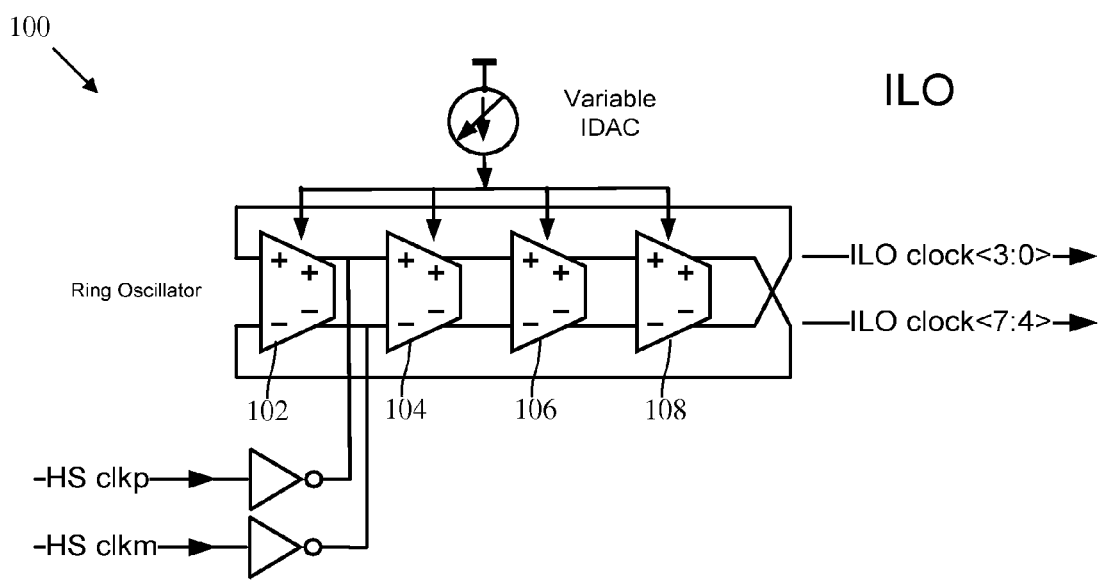
FIG. 1 is a schematic diagram of an embodiment of a ring oscillator.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In a conventional ring oscillator, coarse frequency tuning may be achieved by adjusting load capacitance or switching in and switching out a bank of load capacitors in each delay cell. For instance, to achieve a specified operating frequency with sufficient amplitude, more load capacitors may be switched in to slow the oscillator down. This tuning approach may cause potential issues. For example, to accommodate a relatively wide frequency tuning range, a ring oscillator may need to have a relatively large bank of load capacitors. Further, due to long matched routing to the banks and due to the capacitor bank itself, the load capacitor banks may add parasitic loading to the ring oscillator, which may reduce a maximum speed of the ring oscillator. In addition, compared to other components of the ring oscillator such as inverters and switches, the capacitor bank may occupy a relatively larger area.

The present disclosure teaches embodiments of a multi-path ring oscillator that is re-configurable with digital control bits. The multi-path ring oscillator may comprise three or more delay cells and a processor (e.g., a digital controller) coupled to the delay cells. Connections among the delay cells may form a plurality of loop paths, including a primary path and at least one auxiliary path. Each auxiliary or secondary path may be a feed-forward path configured to reduce phase delay of each delay cell, thereby speeding up the ring oscillator. If desired, one or more auxiliary paths may be tri-stated or switched off, e.g., converting the ring oscillator to a single forward path ring oscillator. Each path may have a number of inverters or inverter slices implemented in each delay cells, and the number of inverters switched on in a path may determine an inverter strength of the path, which in turn affects the oscillating frequency. In addition, the processor coupled to the delay cells may generate a digital control signal (e.g., binary code with multiple bits) to control the opening and closing of the inverters in each path. By adjusting the inverter strength in each path, the processor may tune the operating frequency, the amplitude, or both. In an embodiment, reducing inverter strength in one or more paths leads to a decrease in frequency, and meanwhile leads to an increase in oscillating amplitude (assuming constant source current). Thus, for lower frequencies, less source currents may be needed to provide the same oscillating amplitude. Accordingly, the disclosed ring oscillator may help save power and reduce area overhead.

FIG. 1 is a schematic diagram of an embodiment of a ring oscillator 100. For illustrative purposes, the ring oscillator 100 is shown to comprise four delay cells (or delay stages) 102, 104, 106, and 108. It should be understood that a ring oscillator disclosed herein may include N delay cells, where N is any integer greater than two. The four delay cells 102-108 may be configured to produce eight equally spaced output phases, each separated by 360/8=45 degrees. The eight phase signals may be denoted as ILO clock<3:0> and ILO clock<7:4>. Note that some notations in drawings herein are readily understandable by one of ordinary skill in the art.

In an embodiment, an operating frequency of the ring oscillator 100 may be determined by an input clock. The input clock may be a high speed clock, which is a differential signal with a positive end (denoted as HS clkp) and a negative end (denoted as HS clkm). The high speed clock may be buffered and injected into any one of a plurality of differential nodes in the ring oscillator 100. For example, the high speed clock may be injected at the differential input of the delay cell 104, as shown in FIG. 1. When the ring oscillator 100 locks to the incoming high speed clock, the ring oscillator is considered injection-locked and thus referred to as an ILO.

The ring oscillator 100 may be equipped with coarse and fine tuning capabilities to center the frequency to the high speed input clock. Coarse tuning may be realized by digitally controlling an ILO coarse code, while fine tuning may be realized by adjusting a digital-to-analog converter current (IDAC), which may be controlled by an ILO fine code. Working principles of a ring oscillator are further discussed below.

Figure 2:
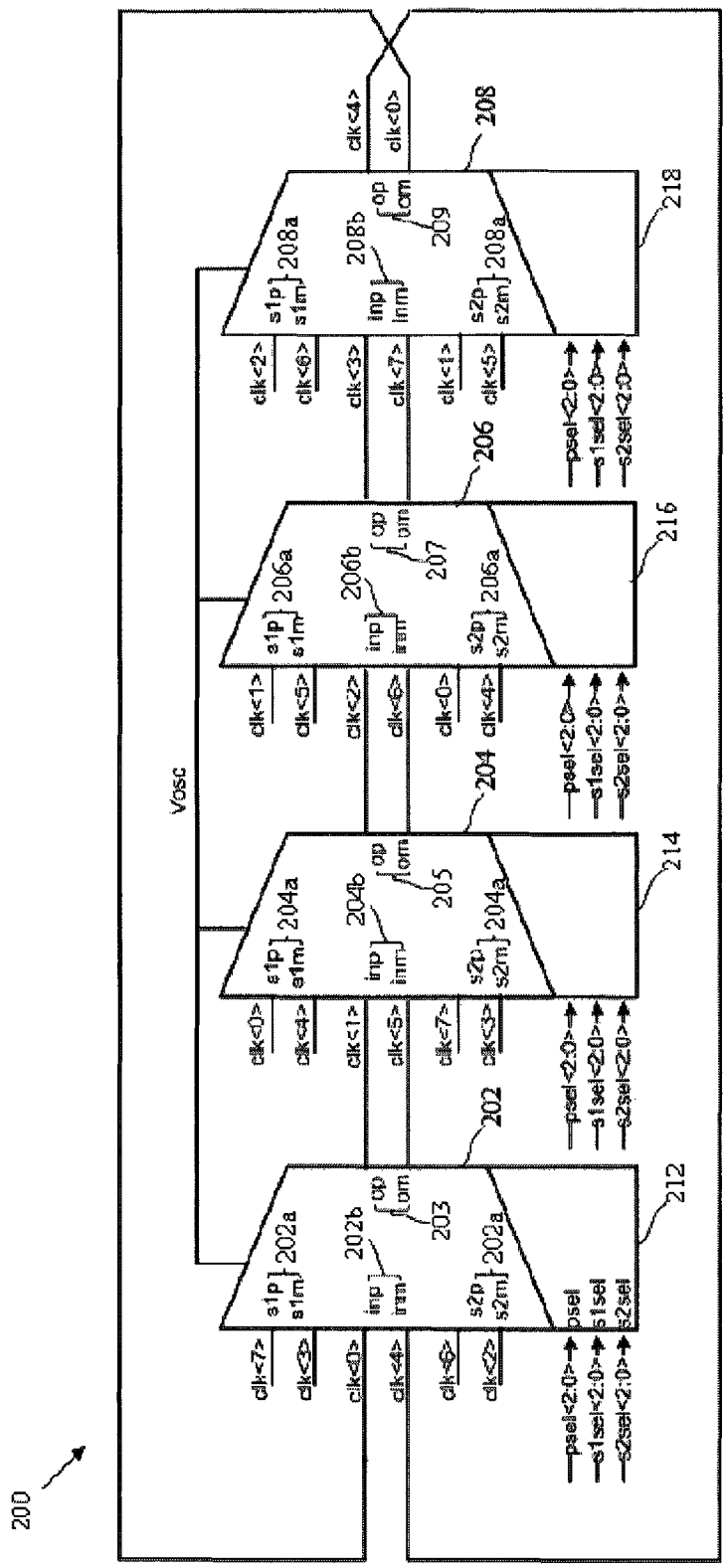
FIG. 2 is a more detailed schematic diagram of an embodiment of a ring oscillator.

FIG. 2 is a more detailed schematic diagram of an embodiment of a ring oscillator 200, which also comprises four delay cells 202, 204, 206, and 208. Each of the delay cells 202-208 may comprise a plurality of differential input leads and a differential output lead, and each of the plurality of differential input leads may comprise one or more inverters (inverters not shown in FIG. 2). Consider the delay cell 202 as an example: the delay cell 202 comprises three differential input leads, including a primary input lead 202a, a second input lead 202b, and a third input lead 202c, and a differential output lead 203. The second and third input leads 202b and 202c are auxiliary input leads, which may provide feedforward input signals and may have no more inverter strength than the primary input lead 202a.

Note that each differential input or output lead may comprise a positive end and a corresponding negative end. For example, the primary input lead 202a has a positive end (denoted as inp) and a negative end (denoted as inm), the second input lead 202b has a positive end (denoted as s1p) and a negative end (denoted as s1m), and the third input lead 202c has a positive end (denoted as s2p) and a negative end (denoted as s2m). In the interest of clarity, some descriptions may focus only on one end, since the other end functions similarly, as one of ordinary skill in the art would recognize. Further, each of the delay cells 202-208 may be driven by a power source denoted as vosc.

The ring oscillator 200 is a multi-pathed oscillator, since its delay cells 202-208 may be coupled to form a plurality of loop paths (in short as path), including a primary path and at least one auxiliary or subsidiary path. The primary path may connect the output lead of each delay cell to the primary input lead of another delay cell, and an auxiliary path may further connect the output lead of each delay cell to a corresponding auxiliary input lead of yet another delay cell. For example, in a primary path shown in FIG. 2, the output lead 203 is connected to an input lead 204a, an output lead 205 is connected to an input lead 206a, an output lead 207 is connected to an input lead 208a, and an output lead 209 is connected to the input lead 202a.

In addition, in a second path shown in FIG. 2, the output lead 203 is further connected to an input lead 206b, the output lead 205 is further connected to an input lead 208b, the output lead 207 is further connected to the input lead 202b, and the output lead 209 is further connected to the input lead 204b. In a third path shown in FIG. 2, the output lead 203 is further connected to an input lead 208c, the output lead 205 is further connected to an input lead 202c, the output lead 207 is further connected to the input lead 204c, and the output lead 209 is further connected to the input lead 206c. Note that, due to the complexity of the circuit, some connecting wires are not shown but the connections are identifiable via lead labels (e.g., labels clk<1> and clk<5> at the output lead 203 and the input lead 206b identify a connection therebetween).

Each of the plurality of paths may form a closed loop. In an embodiment, a combination of the primary path, the second path, and the third path may be configured to generate an oscillating signal with an operating frequency. The second and third paths may be feedforward paths that increase the speed (i.e., operating frequency) of the ring oscillator 200 by reducing the delay of each stage.

The ring oscillator 200 may further comprise a processor coupled to the delay cells 202-208 and configured to tune the operating frequency by digitally adjusting one or more inverter strengths in one or more of the plurality of loop paths. For example, as shown in FIG. 2, four digital controllers or control modules 212, 214, 216, and 218 may be coupled to the delay cells 202-208, respectively. The digital controllers 212-218 may use digital control bits (e.g., binary bits) to adjust the inverter strength of each path formed by the delay cells 202-208.

In an embodiment, adjusting each inverter strength may alter a driving signal produced in a loop path, altering one or more driving signals may change an overall phase delay seen by each delay cell, and changing the overall phase delay may tune the operating frequency. Further, the primary path may be configured to supply a primary driving signal, and each of the at least one auxiliary path may be configured to supply an auxiliary driving signal which has a phase earlier than the primary driving signal. Note that adjusting the inverter strengths in the plurality of loop paths may keep the primary driving signal no less than any of the at least one auxiliary driving signal.

Figure 3:
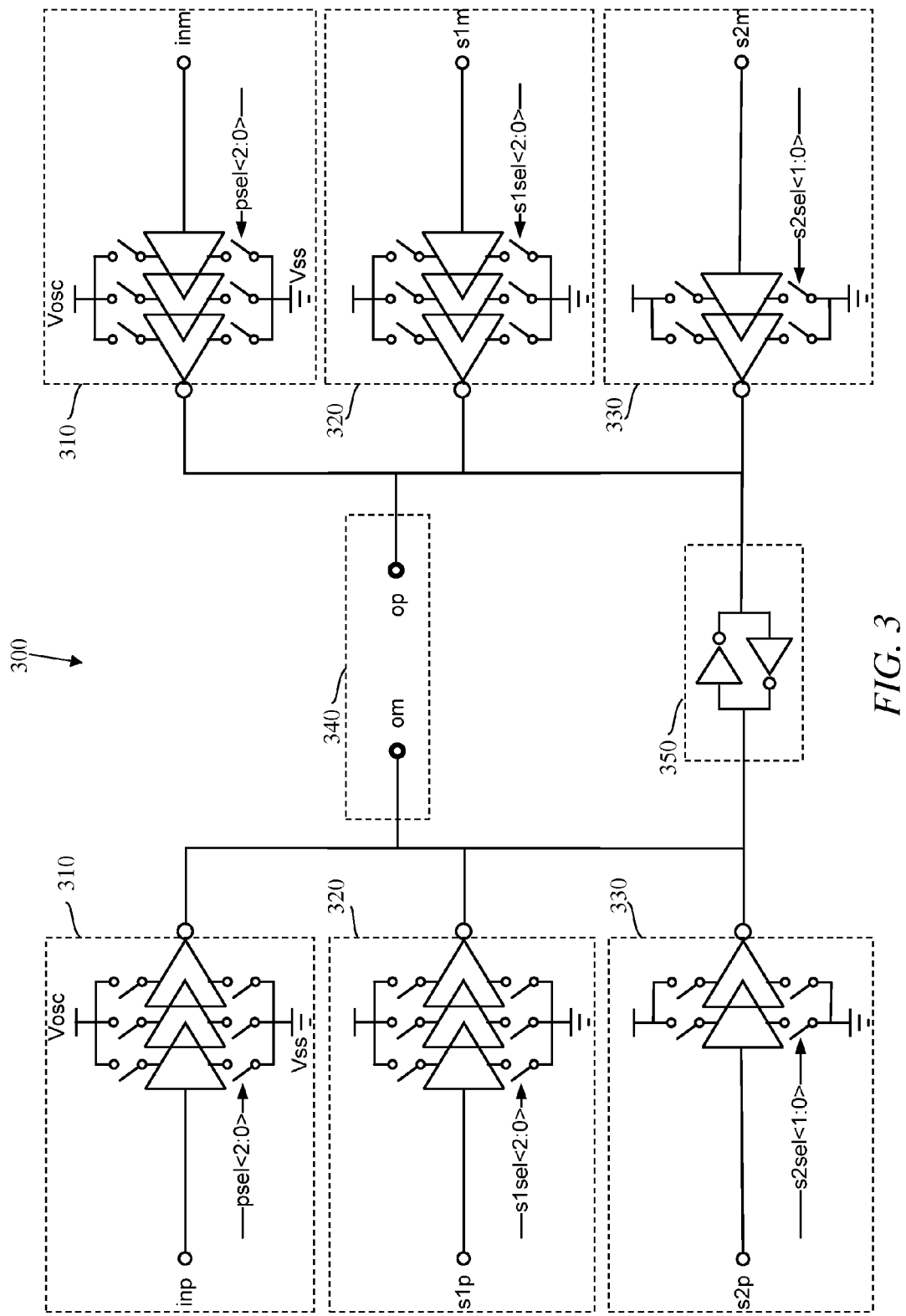
FIG. 3 is a schematic diagram of an embodiment of a delay cell.

FIG. 3 is a schematic diagram of an embodiment of a delay cell 300, which may be any of the delay cells shown in the ring oscillator 100 or 200. Similar to the delay cells 202-208 (in the interest of conciseness, further description will focus on aspects that are different or not yet covered), the delay cell 300 may comprise a primary input lead 310, a second input lead 320, a third input lead 330, and an output lead 340. Note that a positive end and a negative end of each input/output lead may be symmetric, as shown in FIG. 3, thus descriptions may focus on one of the two ends. The delay cell 300 may further comprise an anti-parallel inverting circuit 350 configured to ensure that the output lead 340 produce two signals, at a positive end denoted as op and a negative end denoted as om, having opposite phases. In addition, the delay cell 300 may further comprise load capacitors, which, if needed, may be adjusted to tune the operating frequency.

Each of the plurality of input leads may comprise a number of inverters (number may be any positive integer), which may be implemented as inverter slices or any other type of inverter. As shown in FIG. 3, the primary input lead 310 comprises three inverter slices, which may be controlled by three digital control bits. Similarly, the second input lead 320 comprises three inverter slices, which may be controlled by three digital control bits. The third input lead 330 comprises two inverter slices, which may be controlled by two digital control bits.

In a ring oscillator with multiple delay cells, each delay cell may be configured to have the same or similar structure. Thus, each path may have a number of inverters in each delay cell. For example, if multiple delay cells 300 are used, a primary path has three inverter slices in each delay cell 300, and a third path has two inverter slices in each delay cell 300. Further, the number of inverters in a path may determine an inverter strength provided by the path. We may assume each inverter has the same inverter strength, but it does not have to be that way, as long as the primary path provides no less inverter strength than any auxiliary path.

In an embodiment, each inverter slice may comprise or may be coupled to one or more switches. As shown in FIG. 3, each inverter is connected to a voltage source (denoted as VOSC) via a top switch, and connected to another voltage source or the ground (denoted as VSS) via a bottom switch. Opening and closing of the switches may be controlled by a digital controller, which may generate binary bits as control signals to switch in or switch out any inverter slice. Further, inverters or inverter slices in the second path or the third path may be tri-stated, which may produce a high impedance output. As a result, the second path or the third path may be blocked out in the tri-state. Since the second path or the third path may be a feedforward path, removing these paths may increase the phase delay in each delay cell. In essence, a ring oscillator comprising tri-stated auxiliary path(s) may work as a conventional single path ring oscillator.

Figure 4:
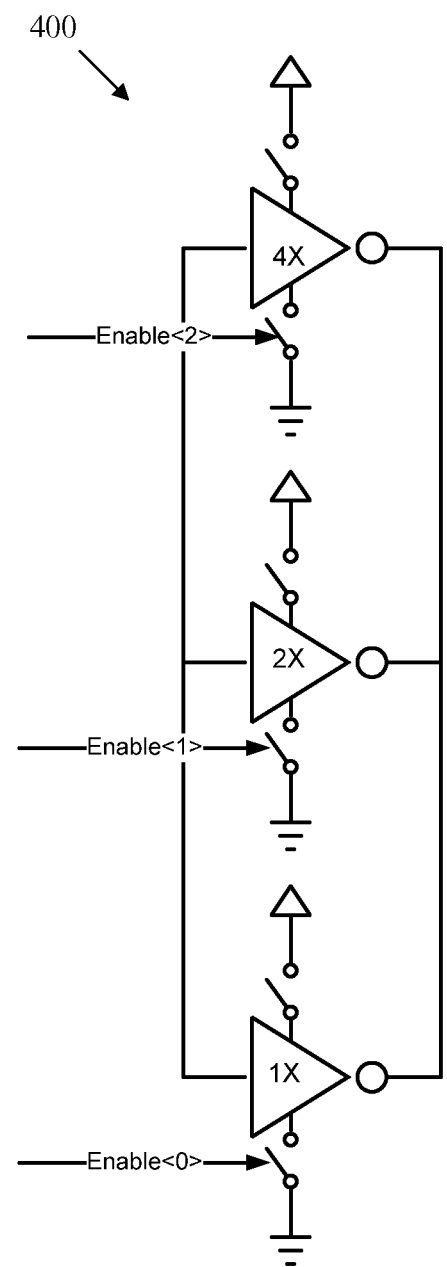
FIG. 4 is a schematic diagram of an embodiment of a digital control circuit, which may be part of a delay cell.

FIG. 4 is a schematic diagram of an embodiment of a digital control circuit 400, which may be part of a delay cell (e.g., the delay cell 300). FIG. 4 shows the inverter portion of the input leads in the delay cells. Specifically, a first number of inverter slices (shown as 4×) are included in a primary path, a second number of inverter slices (shown as 2×) are included in a second parallel path, and a third number of inverter slices (shown as 1×) are included in a third parallel path. In an embodiment, the inverter slices in each path may be binary weighted, and the inverter slices may be enabled and/or disabled by complementary metal-oxide-semiconductor (CMOS) switches. For instance, in a control signal, a total of three bits may be used to control all paths, wherein the first bit (i.e., most significant bit (MSB)) (denoted as Enable<2>) may be dedicated to the primary path, the second bit (denoted as Enable<1>) may be dedicated to the second path, and the third bit (least significant bit (LSB)) (denoted as Enable<0>) may be dedicated to the third path. Note that the primary, secondary, and third paths shown in FIG. 4 may be different from paths as in the multi-path ring oscillator. This digitally controllable inverters or inverter slices indicate how each individual path can be controlled. In FIG. 4, the input and output of each path may be shared. On the other hand, for the multiple ring oscillator paths, outputs may be shared but inputs may be different. As shown in FIG. 4, the 4×, 2×, and 1× here may indicate relative inverter strength determined by bit positions (e.g., the first bit carries 2× the weight of the second bit, and 4× the weight of the third bit). The binary weighting and switching features of the inverter slices allow the inverter strength to be digitally controlled, e.g., by a digital controller. The switches may connect and disconnect an inverter slice from the supply (VOSC) and the ground (VSS).

In an embodiment, a single signal may be used by a digital controller to control the inverter strengths in the plurality of paths present in a ring oscillator. In this case, multiple bits of the signal may be mapped to the plurality of paths. A mapping table may be used by the digital controller to configure a ring oscillator, as an operating frequency is adjusted during calibration.

Table 1 illustrates an embodiment of a mapping table used by a digital controller, which may be a processor implemented as hardware or a combination of hardware and software.

TABLE 1 a mapping table for multiple paths
Calibration Mapping

| vco_cal<3:0> | psel<2:0> | s1sel<2:0> | s2sel<1:0> |
|---|---|---|---|
| 15 | 7 | 5 | 3 |
| 14 | 7 | 5 | 2 |
| 13 | 6 | 4 | 2 |
| 12 | 6 | 4 | 1 |
| 11 | 6 | 4 | 0 |
| 10 | 6 | 3 | 0 |
| 9 | 6 | 2 | 0 |
| 8 | 6 | 1 | 0 |
| 7 | 6 | 0 | 0 |
| 6 | 5 | 0 | 0 |
| 5 | 4 | 0 | 0 |
| 4 | 3 | 0 | 0 |
| 3 | 2 | 0 | 0 |
| 2 | 1 | 0 | 0 |
| 1 (disable) | 0 | 0 | 0 |
| 0 (disable) | 0 | 0 | 0 |

As shown in Table 1, vco_cal represents a control signal, which may be implemented as multiple binary bits. A value of the control signal (e.g., 4 bits with 16 potential values in the range of 0-15) may determine an overall strength of the inverters in a ring oscillator (e.g., the ring oscillator 100 or 200). More specifically, the 4-bit control signal denoted as vco_cal<3:0> may operate as a coarse tuning signal of the ring oscillator, and may map to inverter strengths in the primary, second, and third path. For example, three bits denoted as psel<2:0> represents a first inverter strength in the primary path, three bits denoted as s1sel<2:0> represents a second inverter strength in the second path, and two bits denoted as s2sel<1:0> represents a third inverter strength in the third path.

The mapping table may be designed such that, as the vco_cal increases, the inverter strength in each path may stay the same or increase. According to the mapping table, vco_cal<3:0>=7 determines that the primary, second, and third paths have relative inverter strengths of 6, 0, and 0 accordingly, indicating that the second and third paths are tri-stated or switched out. Vco_cal<3:0>=12 determines that the primary, second, and third paths have relative inverter strengths of 6, 4, and 1 accordingly.

In use, as the overall inverter strength decreases, the ring oscillator may decrease in frequency, which in turn may increase the amplitude of the oscillating signal, according to embodiments disclosed herein. The vco_cal values may be chosen to monotonically decrease the frequency, while increasing the amplitude at the same time. Frequency and amplitude calibrations are further discussed below.

Figure 5A:
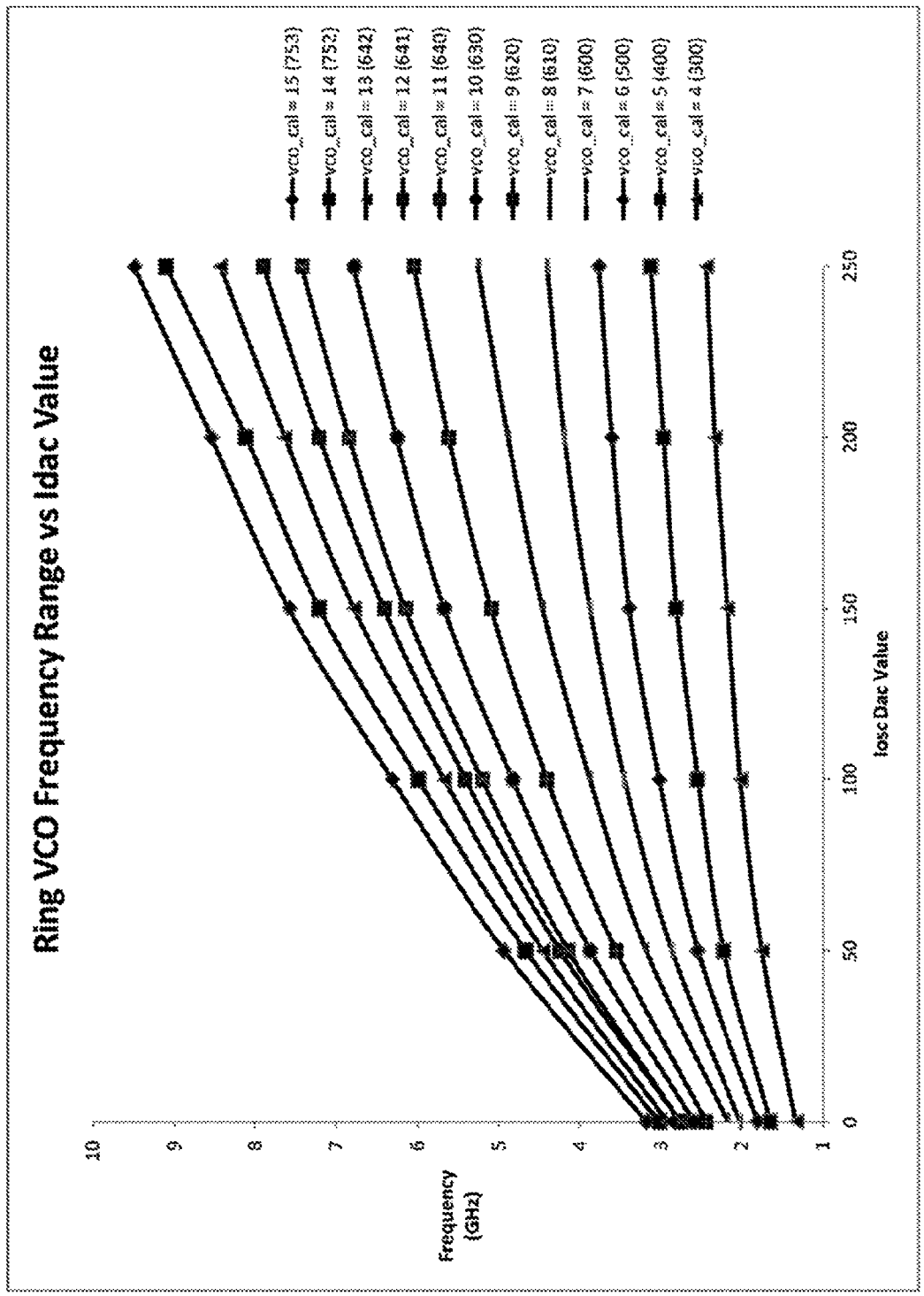
FIGS. 5A and 5B are plots showing measurement results of a disclosed ring oscillator.
Figure 5B:
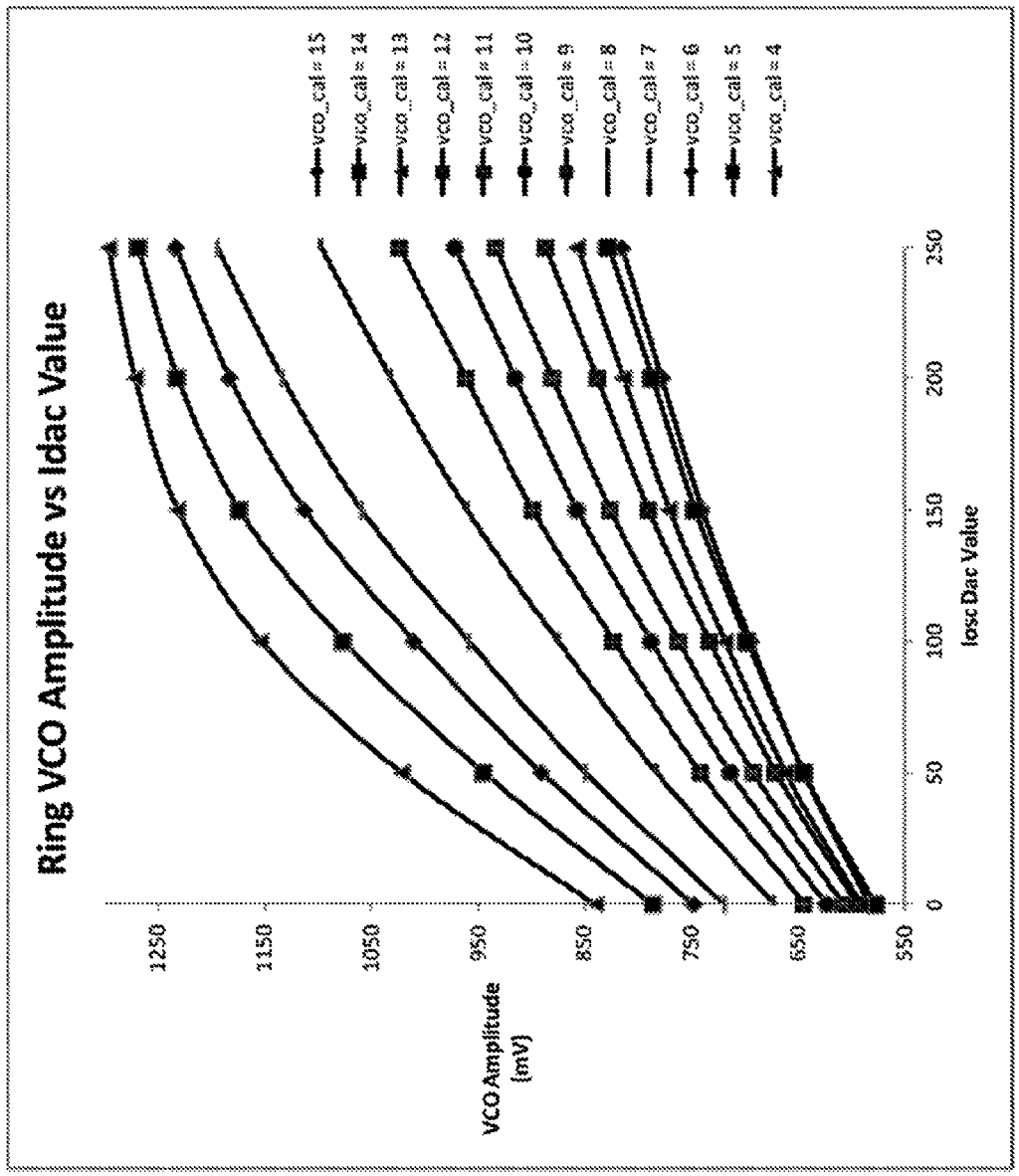

FIGS. 5A and 5B are plots showing measurement results of a disclosed ring oscillator. FIG. 5A shows measurement results correlating the control signal vco_cal, the operating frequency, and the IDAC current of a ring oscillator. The measurement results were obtained on the ring oscillator 300 according to the mapping table in Table 1. It can be seen that, assuming a constant IDAC, as vco_cal decreases, the operating frequency decreases accordingly. Vco_cal coarse tuning settings may result in equally spaced frequency bands in the ring oscillator, as shown in FIG. 5A. Further, for a particular vco_cal value, a higher IDAC current leads to a higher frequency.

FIG. 5B shows measurement results correlating the control signal vco_cal, the amplitude, and the IDAC current of a ring oscillator. It can be seen that, assuming a constant IDAC, as vco_cal decreases, the amplitude increases accordingly. Vco_cal coarse tuning settings may result in equally spaced amplitude bands in the ring oscillator, as shown in FIG. 5B. Further, for a particular vco_cal value, a higher IDAC current leads to a higher amplitude.

Combining FIGS. 5A and 5B, it can be seen that when the frequency decreases, the amplitude increases. To understand the relationship between the frequency and amplitude, a delay cell may have an effective impedance from the perspective of an IDAC current source. As the number of inverter slices decreases, which reduces frequency, the effective impedance increases. Assuming a constant IDAC current, the oscillating amplitude (voltage) may increase accordingly, since voltage=current*impedance. Another way of understanding is that, since the load capacitance remains the same, the change rate of a voltage representing the amplitude remains the same. As frequency decreases, each oscillating period is longer, which gives the oscillating voltage more time to pull up and pull down, leading to a higher amplitude.

Figure 6A:
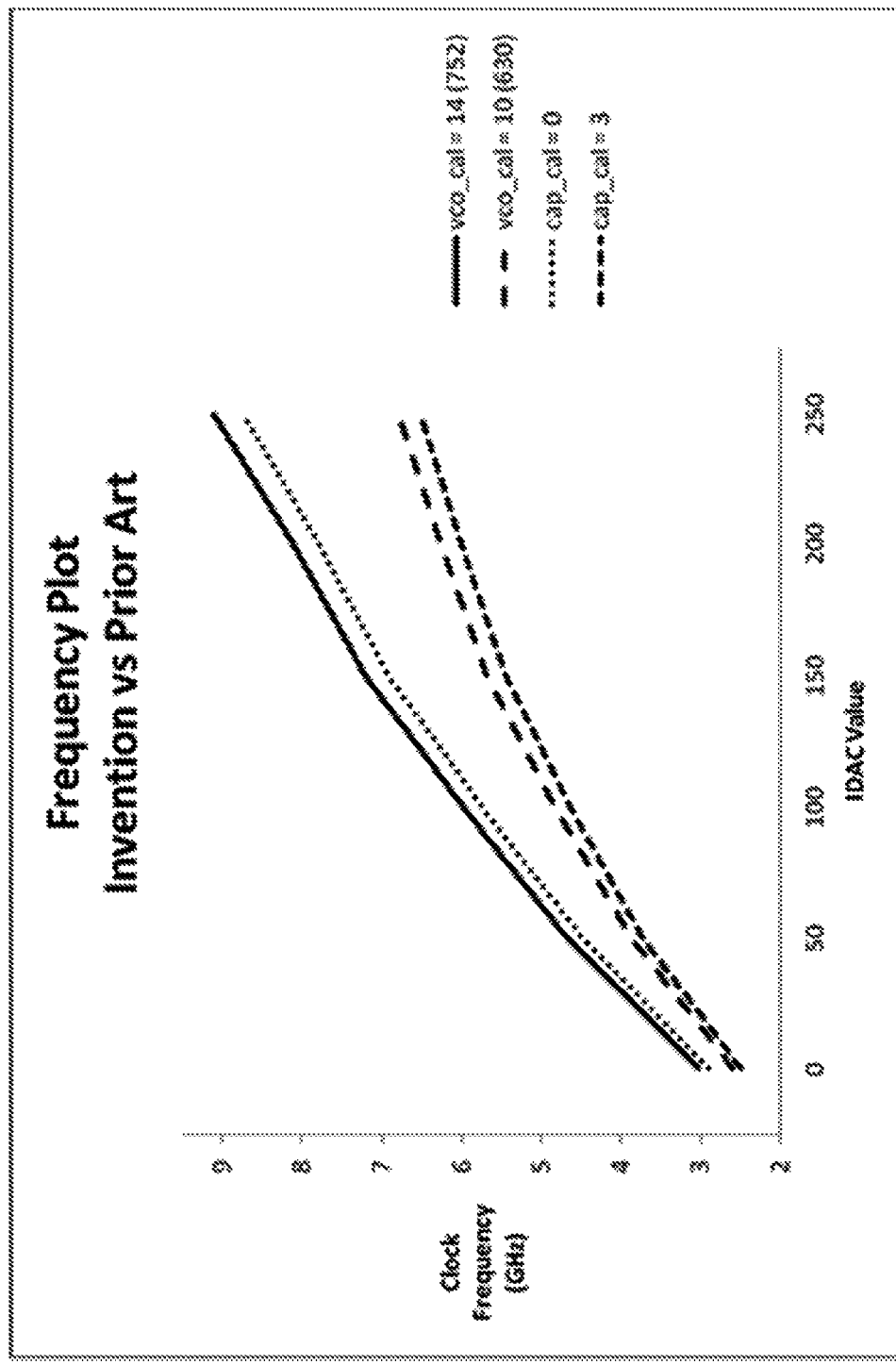
FIGS. 6A and 6B are plots comparing results obtained using an embodiment disclosed herein and a conventional approach.
Figure 6B:
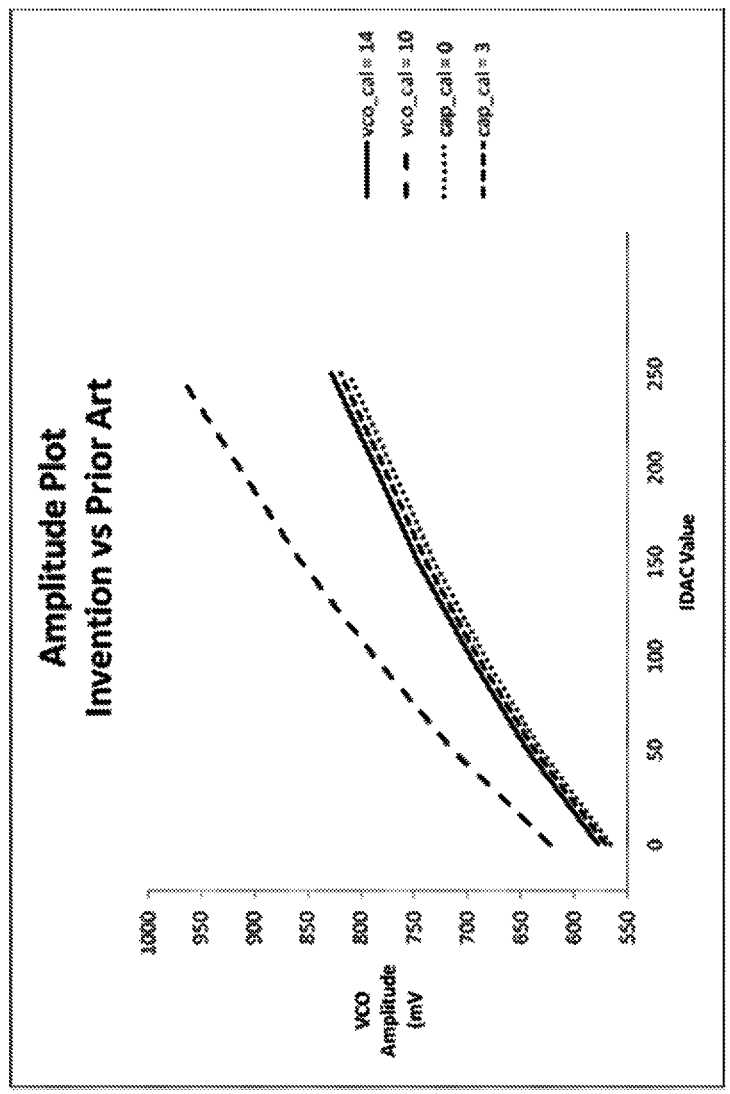

Tuning a frequency by adjusting inverter strength according to embodiments disclosed herein may be advantageous over conventional approaches, which may tune frequency by changing a load capacitance. FIGS. 6A and 6B are plots comparing results obtained using an embodiment disclosed herein (in solid lines) and a conventional approach (in dashed lines). FIG. 6A correlates a control signal value, an IDAC current, and the operating frequency, while FIG. 6B correlates a control signal value, an IDAC current, and the amplitude.

It can be seen that, when the frequency of a ring oscillator drops by reducing the disclosed control signal, the amplitude increases accordingly. The increase in amplitude indicates that it is possible to use a lower IDAC current at lower frequency, and the lower IDAC current leads to power saving. Thus, the disclosure may enable a power of the ring oscillator to be reduced at lower data rates (lower frequency), making it more competitive across a wide range of data rates. Reconfiguration of the control signal may decouple the trade-off between power and amplitude.

In comparison, a conventional approach (that is, adjust load capacitance to tune frequency/amplitude) may not lead to the power saving enabled by the present disclosure. In the conventional approach, when load capacitance increases, the frequency drops for the same IDAC current but the amplitude may remain the same. In other words, the coarse tuning may have no effect on the amplitude (shown by the overlapping dashed lines in FIG. 6B). Amplitude may only be controlled by the IDAC current. This means that to achieve a certain amplitude, a certain amount of IDAC currents may need to be provided, thus power may remain constant regardless of the operating frequency.

Figure 7:
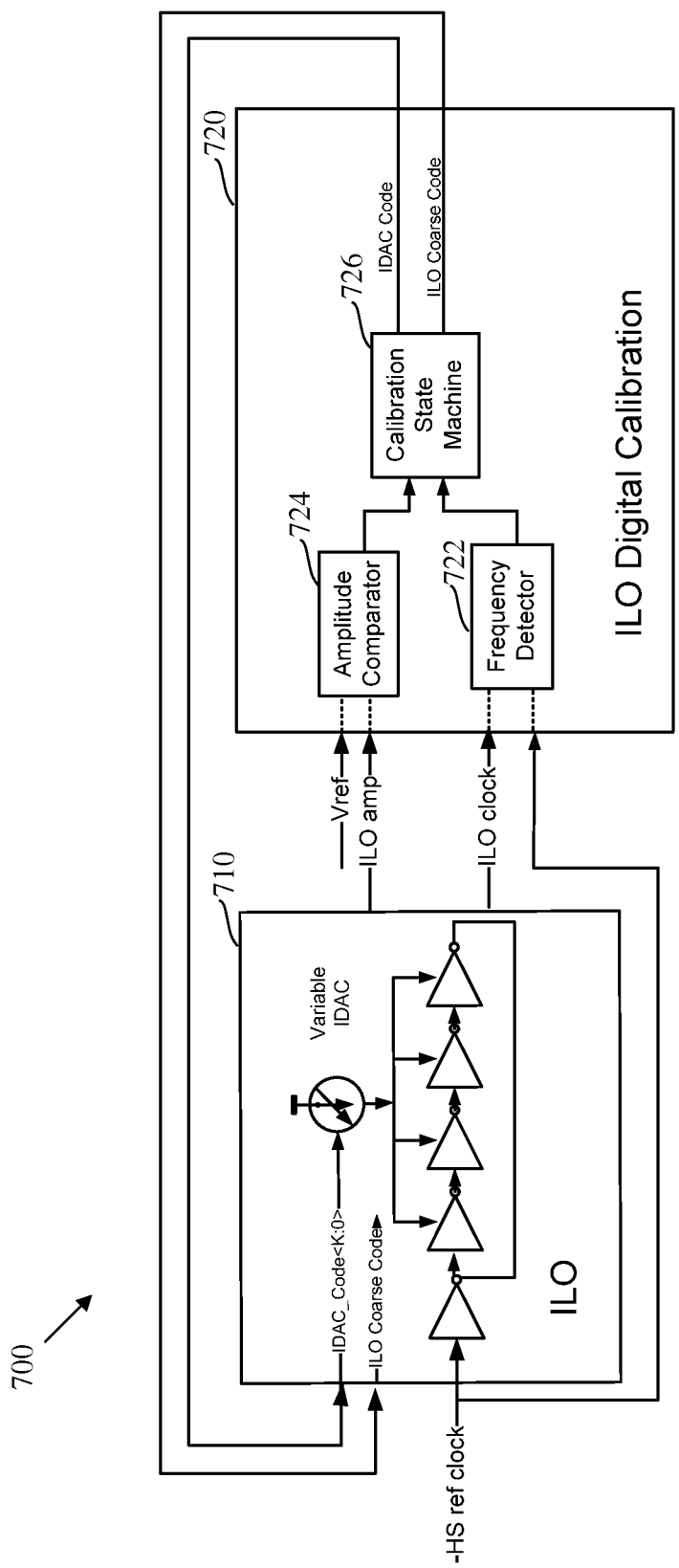
FIG. 7 is a schematic diagram of an embodiment of an injection locked oscillator (ILO).

FIG. 7 is a schematic diagram of an embodiment of an ILO 700, which may comprise an oscillating circuit portion 710 and an ILO digital calibration portion 720. The ILO 700 may be used in various systems such as a multi-rate backplane serializer-deserializer (SerDes) product. The oscillating circuit portion 710 may be configured to generate an oscillating signal with an amplitude and an operating frequency, and the operating frequency may follow an input clock signal (denoted as HS ref clock). The ILO digital calibration portion 720 may be configured to calibrate or tune the frequency and amplitude of the oscillating signal. There may be coarse tuning and fine tuning. A coarse tuning signal (e.g., a multi-bit code denoted as ILO Coarse Code) may be used to adjust the amplitude, while a fine tuning code (denoted as IDAC_code<K:0>) may be used to adjust the frequency.

The ILO digital calibration portion 720 may comprise a frequency detector 722, an amplitude comparator 724, and a calibration state machine 726. The frequency detector 722 may be configured to detect the operating frequency (denoted as ILO clock). The amplitude comparator 724 may be configured to compare an amplitude of the oscillating signal (denoted as ILO amp) with a reference voltage (denoted as Vref).

Note that the oscillating circuit portion 710 (also the digital controllers 212-218 for this matter) may be implemented as a processor. The processor may be implemented as one or more central processor unit (CPU) chips, cores (e.g., a multi-core processor), field-programmable gate arrays (FPGAs), application specific integrated circuits (ASICs), and/or digital signal processors (DSPs). The processor may be implemented using hardware or a combination of hardware and software.

In operation, the oscillating circuit portion 710 may be first configured to its fastest setting (highest frequency). Then, the frequency may be calibrated to the high speed reference clock. The amplitude of the ILO (ILO amp) may be checked against a reference voltage (Vref). If the amplitude is not sufficient, then the coarse tuning code (i.e., digital control signal) may be decremented. As discussed previously, the frequency decreases with a decremented coarse tuning code, and the amplitude increases meanwhile. Next, the frequency may be calibrated again with the new coarse tuning code. If the amplitude is still not sufficient, the coarse tuning code (i.e., digital control signal) may be further decremented. The cycle repeats until the amplitude is larger than the reference voltage (Vref), which may be a programmable value.

For example, referring back to FIGS. 5A and 5B, we may assume that a specified operating frequency is 5 GHz, and a specified minimal amplitude is 0.61 volt (V) (note that any other value works similarly). In this case, an initial tuning code may be set as 15 (according to Table 1, this indicates that inverter strengths are 7, 5, 3 in the primary, second, and third paths). According to FIG. 5B, the smallest IDAC current that generates a 5 GHz signal is about 65 milli-ampere (mA). However, according to FIG. 5A, with an inverter strength of (7 5 3), a 65 mA IDAC current produces about an amplitude of about 0.58 V, which is below the specified amplitude.

Next, the tuning code may be decremented, e.g., from 15 to 14, changing the inverter strengths to be (7 5 2). Again, according to FIG. 5B, the smallest IDAC current that generates a 5 GHz signal is about 77 mA. However, according to FIG. 5A, with an inverter strength of (7 5 2), a 77 mA IDAC current produces about an amplitude of about 0.595 V, which is still below the specified amplitude.

Next, the tuning code may be further decremented, e.g., from 14 to 13, changing the inverter strengths to be (6 4 2). Again, according to FIG. 5B, the smallest IDAC current that generates a 5 GHz signal is about 85 mA. Further, according to FIG. 5A, with an inverter strength of (6 4 2), a 85 mA IDAC current produces about an amplitude of about 0.62 V, which is above the specified amplitude. Thus, the tuning code of 13 and the IDAC current of 85 mA may be set as final settings for the ring oscillator.

Figure 8:
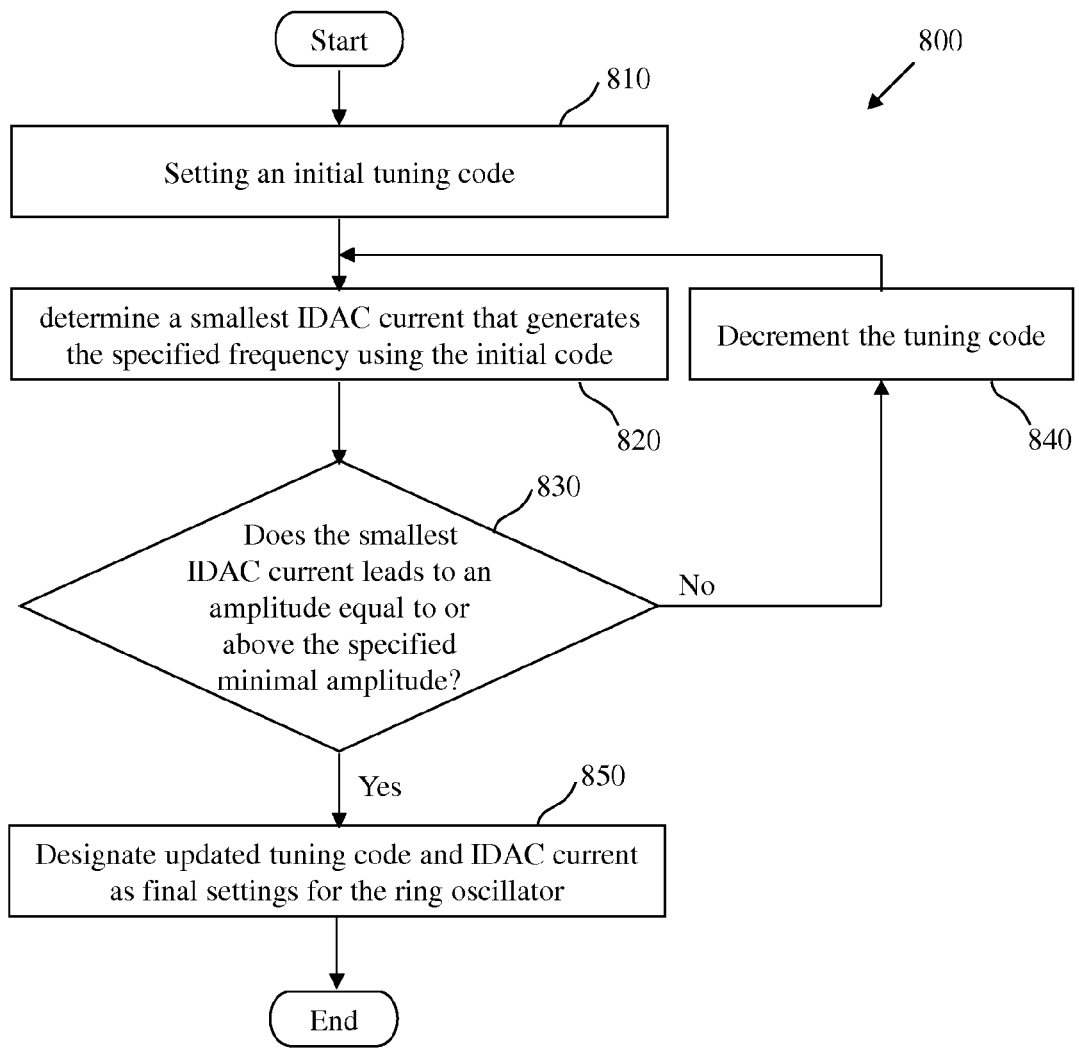
FIG. 8 is a flowchart of an embodiment of a calibration method.

FIG. 8 is a flowchart of an embodiment of a calibration method 800, which may be implemented on ring oscillators disclosed herein (e.g., the ring oscillator 200, 300, or the ILO 700). In practice, an operating frequency and a minimal amplitude may be specified for a particular ring oscillator, thus the method 800 may be used to satisfy both frequency and amplitude requirements while consuming minimal power. The method 800 starts in step 810, in which an initial tuning signal (e.g., binary code) may be set for the ring oscillator under calibration. The initial tuning signal may often be set as the highest binary code, such as 15 (in binary form: 1111) for a 4-bit code. In step 820, the method 800 may determine a smallest IDAC current that generates the specified frequency using the initial code. In step 830, the method 800 may check whether the smallest IDAC current leads to an amplitude equal to or above the specified minimal amplitude. If the condition in the step 830 is met, the method 800 may proceed to step 850, in which the tuning code and the IDAC current may be designated as final settings for the ring oscillator. Otherwise, the method 800 may proceed to step 840, in which the tuning code may decrement. Note that each decrement may be one (e.g., from 15 to 14) or more (e.g., from 15 to 13 or less). The method 800 may return to step 820, where a new smallest IDAC current that generates the specified frequency using the decremented code is determined. The iteration or cycle may repeat until the amplitude equals or surpasses the specified minimal amplitude.

Figure 9:
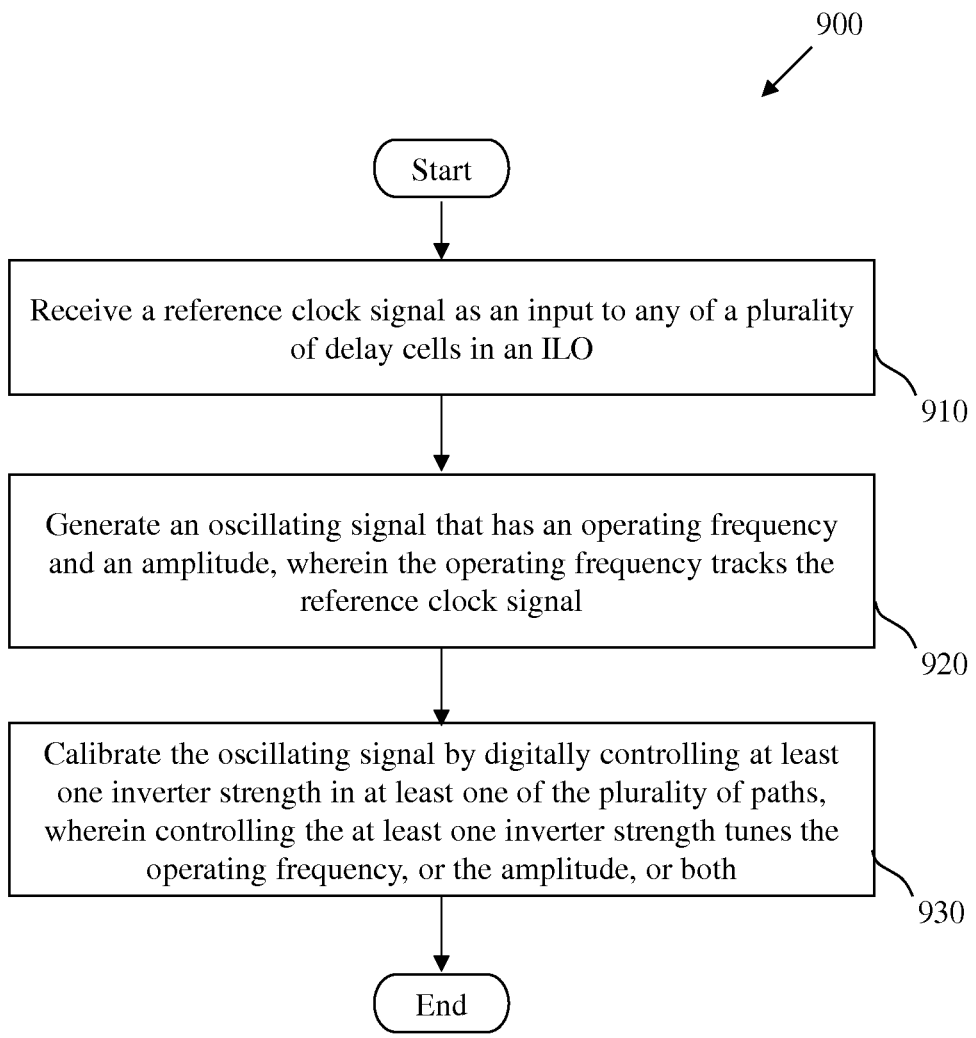
FIG. 9 is a flowchart of an embodiment of another method.

FIG. 9 is a flowchart of an embodiment of another method 900, which may be implemented by a ring oscillator or ILO disclosed herein (e.g., the ring oscillator 200, 300, or the ILO 700). As discussed above, the ILO may comprise three or more delay cells and a plurality of paths formed by connections among the delay cells. The method 900 starts in step 910, in which a reference clock signal (e.g., a high speed clock) may be received as an input to at least one of the delay cells. In step 920, the method 900 may generate an oscillating signal that has an operating frequency and an amplitude. The operating frequency may track a frequency of the reference clock signal. In step 930, the method 900 may calibrate the oscillating signal by digitally controlling at least one inverter strength in at least one of the plurality of paths, wherein controlling the at least one inverter strength tunes the operating frequency, or the amplitude, or both. In an embodiment, digitally controlling the at least one inverter strength is implemented by digital bits without the need to adjust any load capacitance of the ring oscillator.

Further, as discussed above, calibrating the oscillating signal may comprise setting an initial tuning code and iteratively determining a smallest source current that, under an updated tuning code, causes the operating frequency to match a reference frequency and the amplitude to be a smallest amplitude that is equal to or greater than a minimal amplitude specified for the ring oscillator. Note that the updated tuning code in a first iteration is the initial tuning code, and the updated tuning code in any other iteration is decremented from a previous iteration. In addition, the updated tuning code and the smallest source current that causes the operating frequency to match the reference frequency and the amplitude to be the smallest amplitude that is equal to or greater than the minimal amplitude may be designated as final calibrating settings.

As described above, inverter strengths in a plurality of paths including primary, second, and third path may be digitally controlled by a tuning signal. Further, inverters or inverter slices in the second and third paths may be tri-stated, which may enable the ring oscillator to operate with less feed-forward path, e.g., with only a primary path and no feed-forward path, or with one feed-forward path.

The inverter strength in each of the plurality of paths may be individually changed by a calibration signal. An algorithm may be designed in a pre-defined order, which may monotonically increase the speed and reduce the amplitude of the ring oscillator. Changing the inverter strength effectively implements coarse tuning. With this coarse tune approach, one benefit is that the amplitude increases when the ring oscillator slows down.

The disclosed tuning approach may allow a minimal-power calibration algorithm to be implemented, since the tradeoff between frequency and amplitude may have been de-coupled. The calibration algorithm may use coarse tuning control to adjust the amplitude and may use fine tuning control to adjust the frequency. By calibrating the ring oscillator to a constant amplitude for each data rate, a power optimal solution may be found for every data rate.

Compared to prior art, the disclosed ring oscillator may bring about various benefits including reduced power and area overhead. A specified amplitude can be achieved with reduced power compared to prior art. The disclosure may increase a frequency tuning range (e.g., covering 2 GHz to 7.5 GHz or higher), and provide additional degree of freedom for optimizing the ring oscillator. The disclosure may make it possible to implement a calibration routine which can optimize the noise and power for a desired data rate.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means+/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A ring oscillator comprising:
    three or more delay cells, each of which comprises a plurality of differential input leads and a differential output lead, wherein each of the plurality of differential input leads comprises one or more inverters,
    wherein the three or more delay cells are inter-connected forming a plurality of loop paths, wherein each loop path connects the differential output lead of each delay cell to a corresponding differential input lead of another delay cell, wherein each loop path provides an inverter strength determined by a number of inverters in a corresponding differential input lead of each delay cell,
    wherein the plurality of loop paths are configured to generate an oscillating signal with an operating frequency, and wherein the operating frequency is tunable by digitally adjusting one or more inverter strengths in one or more of the plurality of loop paths.

2. The ring oscillator of claim 1, wherein the plurality of differential input leads in each delay cell comprise a primary input lead and at least one auxiliary input lead, wherein the plurality of paths comprise a primary path and at least one auxiliary path, wherein the primary path positively connects the differential output lead of each delay cell to a corresponding primary input lead of another delay cell, and wherein each auxiliary path negatively connects the differential output lead of each delay cell to a corresponding auxiliary input lead of another delay cell.

3. The ring oscillator of claim 2, wherein the primary path is configured to supply a primary driving signal, and each of the at least one auxiliary path is configured to supply an auxiliary driving signal which has a phase earlier than the primary driving signal, and wherein adjusting the inverter strengths in the plurality of loop paths keeps the primary driving signal no less than any of the at least one auxiliary driving signal.

4. The ring oscillator of claim 2, wherein each loop path comprises a number of inverter slices coupled to one or more switches, wherein each inverter strength in a loop path is determined by the number of inverter slices in the loop path, and wherein adjusting the one or more inverter strengths comprises switching in or switching out inverter slices in one or more loop paths.

5. The ring oscillator of claim 4, wherein each inverter slice in the at least one auxiliary path is tri-stated, and wherein adjusting the inverter strengths comprises disabling the at least one auxiliary path such that each inverter slice therein has a high impedance output.

6. The ring oscillator of claim 4, wherein the one or more inverter strengths are digitally adjusted by a single control signal, and wherein the control signal comprises a number of binary bits used to determine whether each inverter slice in the plurality of loop paths should be switched in or switched out.

7. A ring oscillator comprising:
    a plurality of delay cells, each of which comprises a primary input lead, a second input lead, and an output lead, wherein the primary input lead and the second input lead in each delay cell are differential leads, wherein the primary input lead of each delay cell comprises a first number of inverter slices, wherein the second input lead of each delay cell comprises a second number of inverter slices,
    wherein the plurality of delay cells are coupled to provide a primary path and a second path, wherein the primary path connects the output lead of each delay cell to a corresponding primary input lead of another delay cell, wherein the second path further connects the output lead of each delay cell coupled to a corresponding second input lead of another delay cell, and wherein the primary path and the second path are configured to generate an oscillating signal with an operating frequency; and
    a digital controller coupled to the plurality of delay cells and configured to control a first inverter strength in the primary path and a second inverter strength in the second path, wherein the first and second inverter strengths are determined by the first and second numbers of inverter slices, respectively, and wherein controlling at least one of the first and second inverter strengths tunes the operating frequency.

8. The ring oscillator of claim 7, wherein each of the plurality of delay cells further comprises a third input lead, wherein the third input lead of each delay cell comprises a third number of inverter slices,
   wherein the plurality of delay cells are further coupled to provide a third path which further connects the output lead of each delay cell coupled to a corresponding third input lead of another delay cell,
   wherein the third path contributes to the generation of the oscillating signal, and
   wherein the digital controller is further configured to control a third inverter strength in the third path, wherein the third inverter strength is determined by the third number of inverter slices, and wherein controlling at least one of the first, second, and third inverter strengths tunes the operating frequency.

9. The ring oscillator of claim 8, wherein the plurality of delay cells comprise first, second, third, and fourth delay cells, and wherein, in the primary path, the output lead of the first delay cell is connected to the primary input lead of the second delay cell, the output lead of the second delay cell is connected to the primary input lead of the third delay cell, the output lead of the third delay cell is connected to the primary input lead of the fourth delay cell, and the output lead of the fourth delay cell is connected to the primary input lead of the first delay cell.

10. The ring oscillator of claim 9, wherein, in the second path, the output lead of the first delay cell is further connected to the second input lead of the third delay cell, the output lead of the second delay cell is further connected to the second input lead of the fourth delay cell, the output lead of the third delay cell is further connected to the second input lead of the first delay cell, and the output lead of the fourth delay cell is further connected to the second input lead of the second delay cell.

11. The ring oscillator of claim 10, wherein the primary input lead, the second input lead, and the output lead in each delay cell each comprise a positive end and a negative end, and wherein, in the third path, the output lead of the first delay cell is further connected to the third input lead of the fourth delay cell, the output lead of the second delay cell is further connected to the third input lead of the first delay cell, the output lead of the third delay cell is further connected to the third input lead of the second delay cell, and the output lead of the fourth delay cell is further connected to the third input lead of the third delay cell.

12. The ring oscillator of claim 8, wherein controlling the first inverter strength in the primary path comprises determining how many of the first number of inverter slices to use in the primary input lead of each delay cell, wherein controlling the second inverter strength in the second path comprises determining how many of the second number of inverter slices to use in the second input lead of each delay cell, and wherein controlling the first, second, and third inverter strengths keeps the first inverter strength no less than the second inverter strength, and the second inverter strength no less than the third inverter strength.

13. The ring oscillator of claim 12, wherein the first and second numbers of inverter slices in each delay cell are all binary weighted, wherein each inverter slice is coupled to one or more switches, and wherein determining how many of the first and second numbers of inverter slices to use is implemented by switching in or switching out the switches.

14. The ring oscillator of claim 13, wherein controlling the second inverter strength comprises switching each of the second numbers of inverter slices to a tri-state to disable the second path.

15. The ring oscillator of claim 12, wherein controlling the first, second, and third inverter strengths is realized by a single control signal generated by the digital controller, and wherein the single signal comprises four binary bits whose value determine all of the inverter strengths.

16. A method implemented by a ring oscillator that comprises three or more delay cells and a plurality of paths formed by connections among the delay cells, the method comprising:
    receiving reference clock signals at a plurality of differential inputs in each of the delay cells;
    generating an oscillating signal that has an operating frequency and an amplitude; and
    calibrating the oscillating signal by digitally controlling at least one inverter strength in at least one of the plurality of paths, wherein controlling the at least one inverter strength tunes the operating frequency, or the amplitude, or both, wherein each path provides an inverter strength determined by a number of inverters in a corresponding differential input lead of each delay cell.

17. The method of claim 16, wherein the operating frequency tracks a frequency of the reference clock signals, and wherein digitally controlling the at least one inverter strength is implemented by digital bits without the need to adjust any load capacitance of the ring oscillator.

18. The method of claim 17, wherein the delay cells comprise first, second, third and fourth delay cells, wherein the plurality of paths comprise first, second, and third paths having first, second, and third inverter strengths, respectively, wherein the digital bits are provided to the ring oscillator as a control code with four binary bits, and wherein a relative relationship between the first inverter strength denoted as psel, the second inverter strength denoted as s1sel, and the third inverter strength denoted as s2sel, is determined by the control code denoted as vco_cal, according to the following mapping table:

| vco_cal | psel | s1sel | s2sel |
|---------|------|-------|-------|
| 15 | 7 | 5 | 3 |
| 14 | 7 | 5 | 2 |
| 13 | 6 | 4 | 2 |
| 12 | 6 | 4 | 1 |
| 11 | 6 | 4 | 0 |
| 10 | 6 | 3 | 0 |
| 9  | 6 | 2 | 0 |
| 8  | 6 | 1 | 0 |
| 7  | 6 | 0 | 0 |
| 6  | 5 | 0 | 0 |
| 5  | 4 | 0 | 0 |
| 4  | 3 | 0 | 0 |
| 3  | 2 | 0 | 0 |
| 2  | 1 | 0 | 0 |
| 1  | 0 | 0 | 0 |
| 0  | 0 | 0 | 0. |

19. The method of claim 16, wherein digitally controlling the at least one inverter strength comprises changing a number of inverters connected in a path by switching in or switching out one or more inverters in the path, wherein switching in the one or more inverters causes the operating frequency to increase and the amplitude to decrease, and wherein switching out the one or more inverters causes the operating frequency to decrease and the amplitude to increase.

20. The method of claim 16, wherein calibrating the oscillating signal comprises:
   setting an initial tuning code; and
   iteratively determining a smallest source current that, under an updated tuning code, causes the operating frequency to match a reference frequency and the amplitude to be a smallest amplitude that is equal to or greater than a minimal amplitude specified for the ring oscillator,
   wherein the updated tuning code in a first iteration is the initial tuning code, wherein the updated tuning code in any other iteration is decremented from a previous iteration, and wherein the updated tuning code and the smallest source current that causes the operating frequency to match the reference frequency and the amplitude to be the smallest amplitude that is equal to or greater than the minimal amplitude are designated as final calibrating settings.

* * * * *